United States Patent [19]

Ho

[11] Patent Number: 5,030,928
[45] Date of Patent: Jul. 9, 1991

[54] ZERO CROSSING MODULATOR

[76] Inventor: Wilson H. K. Ho, 9708 - 35th Ave., NE., Seattle, Wash. 98115

[21] Appl. No.: 591,083

[22] Filed: Oct. 1, 1990

[51] Int. Cl.[5] .......................... H03C 3/22; H04L 27/12
[52] U.S. Cl. ................................ 332/102; 332/136; 375/65
[58] Field of Search ................. 332/100–105, 332/136; 375/44–57, 62, 65, 67

[56] References Cited

U.S. PATENT DOCUMENTS 4,538,136  8/1985  Drabing ..................... 332/100 X Primary Examiner—Siegfried H. Grimm
Attorney, Agent, or Firm—Seed and Berry

[57] ABSTRACT

A method and apparatus for modulating a radio frequency signal with digital data including: a variable oscillator, a modulator for varying the oscillator's output, a network for detecting when the oscillator's output crosses its zero axis, a storage device for storing an applied data bit, and wherein the storage device applies the data bit to the modulator when the oscillator's output is at its zero crossing point.

10 Claims, 5 Drawing Sheets

ZERO CROSSING MODULATOR

DESCRIPTION

1. Technical Field

The present invention generally relates to radio frequency modulators. More particularly, it relates to a system for modulating a radio frequency signal with digital information such that higher data transmission rates can be achieved on a narrow bandwidth channel.

2. Background of the Invention

Since the first telegraph systems were implemented in the 1830's, the amount of information that can be transmitted over a given medium, whether wire, free space, or fiber optics, has been a concern. This problem is particularly acute in free space transmissions since with wire and fiber optic systems additional lines can be installed if needed.

To increase the information transmittable, it is standard practice to distribute information into bands of frequencies, called channels. For example, in the United States television channel 2 uses frequencies between 54 and 60 megahertz while channel 3 uses frequencies between 60 and 66 megahertz. The channel frequencies, channel bandwidths, field strengths, and other parameters are governmentally regulated, in the U.S.A. by the Federal Communications Commission (FCC).

While the use of channels to distribute information is highly successful, the large number of users desiring to transmit information has necessitated use of narrow bandwidth channels. Narrow bandwidth channels are acceptable for voice communications since the frequencies of interest are themselves quite narrow. However, in the past, high-speed digital data transmissions required wider channel bandwidths than typically allocated.

The channel bandwidth requirement is a consequence of the upper and lower sidebands generated when a signal modulates an RF carrier. Modulation, the proceed wherein information is encoded onto an RF carrier, can take many forms; amplitude, phase and frequency modulation being the most common. The effects of these sidebands must be restricted to the allocated channel so that interference with other channels is avoided. The generation of sidebands is due to the modulation signals being applied and removed randomly on peaks and valleys of the RF carrier. The zero crossing point corresponds to the time averaged value of the RF carrier signal.

Much work has gone into methods for reducing channel bandwidth requirements. For example, U.S. Pat. No. 3,962,639, issued to Kermode, June 8, 1976, entitled "System for Reducing Radio Communication Frequency Bandwidth and Increasing the Number of Channels Available," discloses a modulation technique that reduces bandwidth capacity by limiting the amplitude of the modulation signals. Another patent, U.S. Pat. No. 4,596,022, issued to Stoner, June 17, 1986, entitled "FSK Data Communication System," discloses a system for digital data communication over a limited bandwidth using special frequency shift keying techniques.

While these methods have been effective in some cases, a more general method of reducing channel bandwidth requirements when modulating an RF carrier with digital signals has not been available. Therefore, it will be appreciated that there has been a need for a low-cost, easily implemented method of transmitting digital data at high speeds using a reduced channel bandwidth.

SUMMARY OF THE INVENTION

It is an object of the present invention to provide a system for modulating a radio frequency signal with digital data such that high-speed digital communications is achieved with a reduced channel bandwidth.

This and other objects, which will become apparent as the invention is more fully described below, are obtained by providing a method and apparatus for transmitting digital data at high speed on a relatively narrow bandwidth channel. In the preferred embodiment, the system includes a variable frequency oscillator for generating an RF signal, a modulator for varying the oscillator's frequency, a network for detecting when the RF signal is at its zero crossing point, a storage device for storing an applied data bit, and application of the stored data bit to the modulator to change the oscillator's frequency when the RF signal is at its zero crossing point.

DETAILED DESCRIPTION OF THE INVENTION

Figure 1:
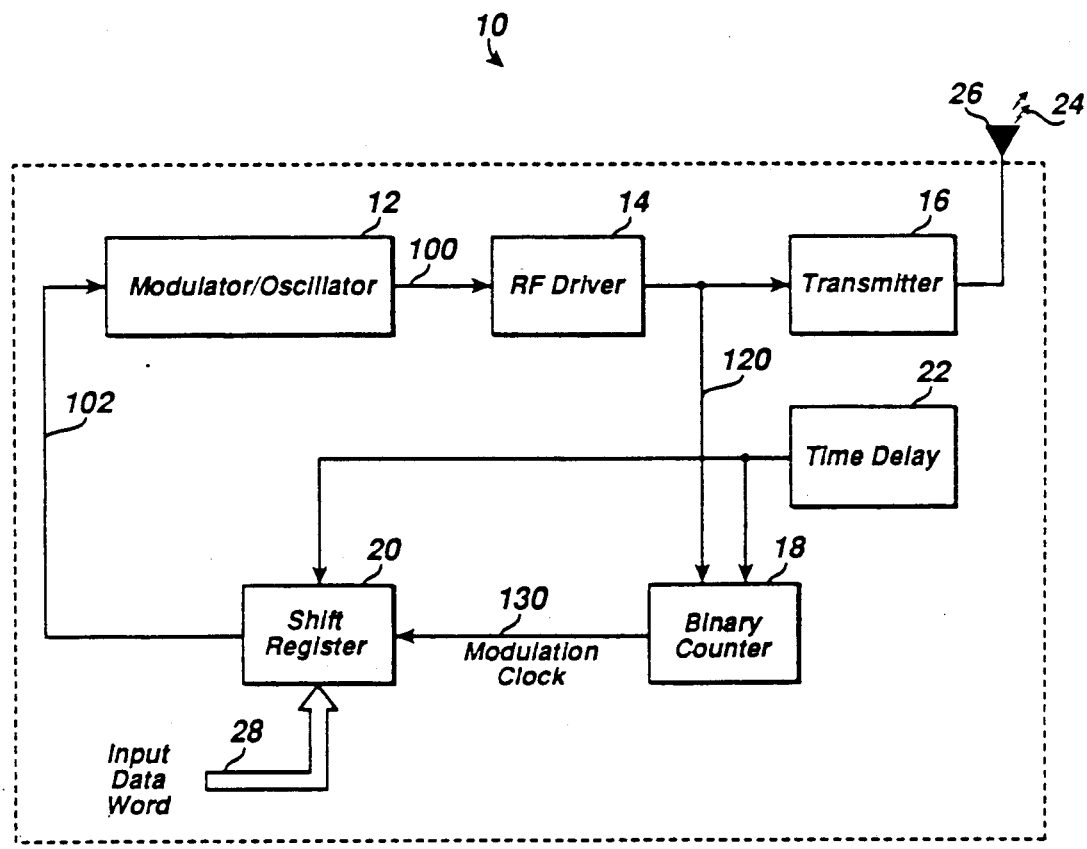
FIG. 1 is a block diagram illustrating a preferred embodiment of the transmitter used in the present invention.
Figure 2:
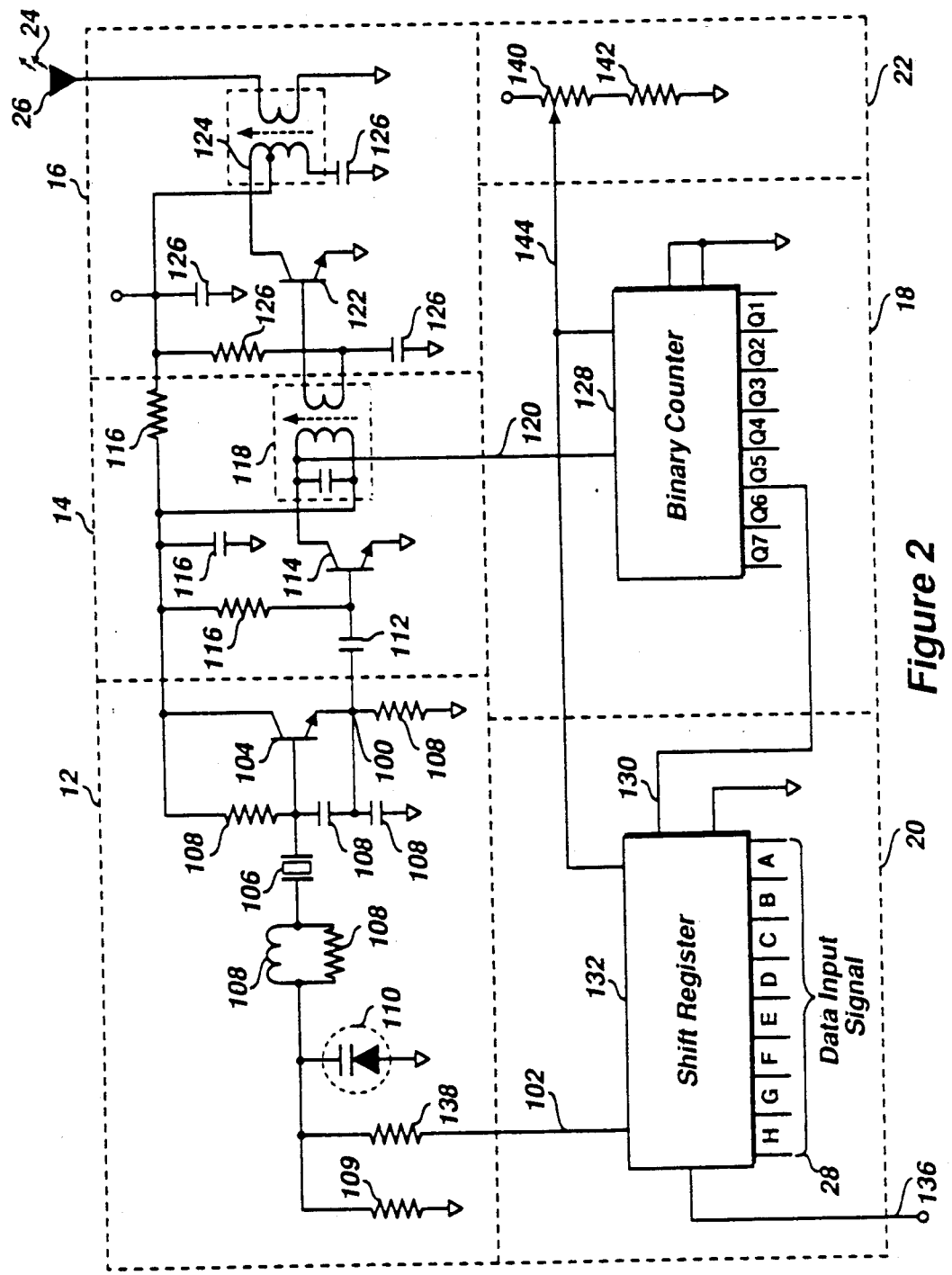
FIG. 2 is a schematic diagram showing a preferred implementation of the invention illustrated in FIG. 1.

The preferred embodiment of the present invention is shown in block diagram form in FIG. 1 and in schematic form in FIG. 2. The preferred embodiment is a frequency modulated transmitter for radiating digital information. However, the principles of the present invention are also applicable to amplitude and phase modulators. Referring now to FIG. 1, the preferred embodiment system 10 includes: a modulator/oscillator 12, an RF driver 14, a transmitter 16, a binary counter 18, a shift register 20, and a time delay network 22. The preferred embodiment system modulates an RF signal with digital data applied on a data bus 28. The modulation occurs only when the signal passes through its zero cross point. The zero crossing point corresponds to the time averaged value of the RF signal. The modulated RF signal is transmitted from an antenna 26, via the transmitter 16, as a transmitted RF signal 24. To assist understanding, like numbered blocks and locations in FIG. 1 correspond to like numbered sections and locations in FIG. 2.

Figure 3:
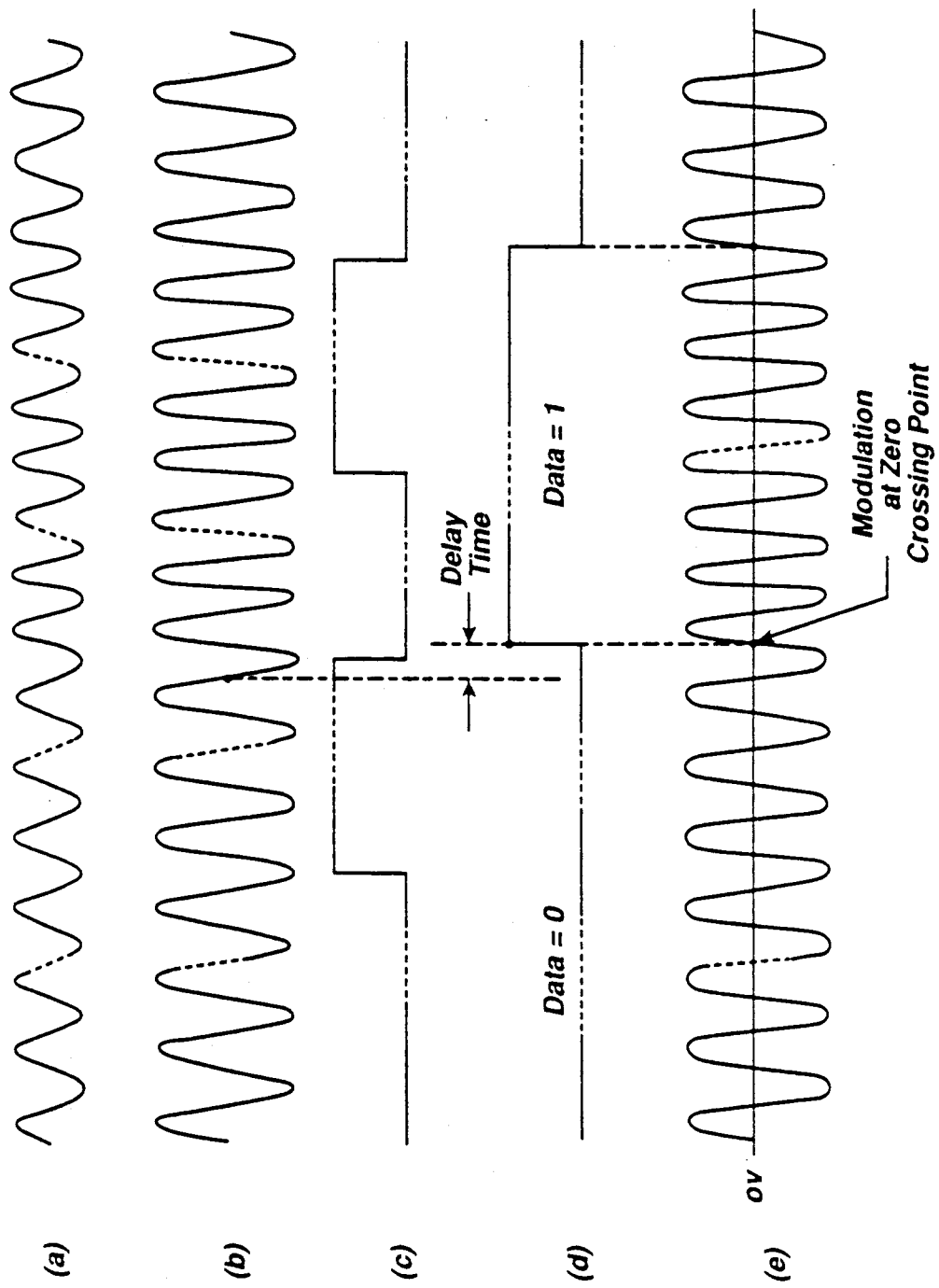
FIG. 3 depicts typical waveforms at several locations of FIGS. 1 and 2.

Modulator/oscillator 12, the oscillator section:

The transmitted RF signal 24 in the preferred embodiment system is generated in the modulator/oscillator 12. As shown in FIGS. 1 and 2, the output of the modulator/oscillator 12 is applied on a line 100 to the RF driver 14. A typical output waveform is depicted in FIG. 3(a). As subsequently explained, the frequency of the output depicted in FIG. 3(a) varies according to a modulation signal applied on a modulation line 102.

As shown in FIG. 2, the preferred modulator/oscillator 12 includes a transistor 104, a crystal 106, bias and feedback components 108, a resistor 109, a voltage variable capacitor, VCAP 110, which together form a crystal controlled oscillator. The frequency of the crystal controlled oscillator depends not only on the just mentioned components, but also upon the voltage of the modulation signal on the modulation line 102.

RF Driver 14:

As shown most clearly in FIG. 1, the RF driver 14 is used to drive the transmitter 16 and to apply a signal to the binary counter 18. The preferred RF driver network is shown in FIG. 2. The oscillator output at location 100 is coupled, via a capacitor 112, to an amplifying transistor 114. The transistor 114 amplifies the output of the modulator/oscillator 12 to a suitable level to drive the transmitter 16 and to enable operation of the binary counter 18. Biasing and filtering components 116 assist the operation of the transistor 114. A tuned transformer 118 couples the output of the RF driver 14 to the transmitter 16. A sample of the RF driver output is applied to the binary counter 18 Via a line 120. The waveform of the signal on line 120 is illustrated in FIG. 3(b).

Transmitter 16:

As best shown in FIG. 1, and as discussed above, an output from the RF driver 14 is applied to the transmitter 16. The preferred embodiment transmitter 16 is shown in FIG. 2. The output of the RF driver 14 is coupled to a power transistor 122 via the transformer 118. The power transistor 122 amplifies the RF driver output and applies it, via a transformer 124, to the antenna 26, which radiates a representation of the RF driver output as the transmitted RF signal 24. Biasing and filtering components 126 assist operation of the transmitter 16. A typical transmitted RF signal 24 is shown in the frequency domain, with suppressed sidebands, in FIG. 4.

Binary Counter 18:

The binary counter 18, shown in FIGS. 1 and 2, divides the output of the RF driver 14 to create a modulation clock on a line 130. The preferred circuit for deriving the modulation clock is illustrated in FIG. 2. The binary counter 128 receives the output of the RF driver 14 on the line 120 and divides the RF driver output by successive powers of two. For example, for every two cycles of the RF driver output, an output from the binary counter 18 occurs on the Q1 port; for every four RF cycles, an output occurs on the Q2 port; and so on. As shown in FIG. 2, the modulation clock is taken from the Q5 port. Thus, at every thirty-second cycle of the RF driver output, a modulation clock pulse occurs on the line 130. This modulation clock pulse, shown in FIG. 3(c), is applied to the shift register 20. While FIG. 2 shows the modulation clock pulse as being taken from the Q5 port, the selection of an appropriate modulation clock depends on the application. In some applications, other ports are more suitable.

Shift Register 20:

In the preferred embodiment, the digital information to be transmitted is applied as a sequence of 8-bit words. On each occurrence of the modulation clock pulse, another of the eight bits is applied to the modulator/oscillator 12. The preferred method of accomplishing this is illustrated in FIG. 2. The shift register 132 has an 8-bit word applied to it via the data input bus 28. When a data load command on a data load line 136 occurs, the 8-bit word is latched into the shift register 132. When a modulation clock pulse is applied to the shift register 132, a single bit of the stored 8-bit word is applied to the modulator/oscillator 12; when the next modulation clock pulse is applied, the next bit of the stored 8-bit word is applied; and so on. Since the modulation clock is derived from the RF driver output on line 120, the application of each bit is ideally synchronized with the RF driver output. A bit applied to the modulator/oscillator 12 is shown in FIG. 3(d). After all 8 bits are applied to the modulator/oscillator 12, another 8-bit word on the data input bus 28 is latched into the shift register 132.

Modulator/oscillator, the modulator operation:

As shown in FIGS. 1 and 2, and as previously mentioned, the modulation signal on the modulation line 102 is applied to the modulator/oscillator 12. The modulation signal causes the frequency of the RF driver output on line 120 to vary. Since in the preferred embodiment the modulation signal on line 102 is a digital bit, the RF driver output will be at one of two frequencies. As illustrated in FIG. 2, the modulation signal is applied via a resistor 138 to the modulator/oscillator 12. The modulation signal is applied to a voltage divider comprised of the resistors 138 and 109, and the output of the voltage divider is applied to the VCAP 110. The VCAP 110 changes its capacitance depending on the voltage across it. Since the VCAP 110 is part of the oscillator circuit, changes in its capacitance changes the oscillator frequency.

Figure 4:
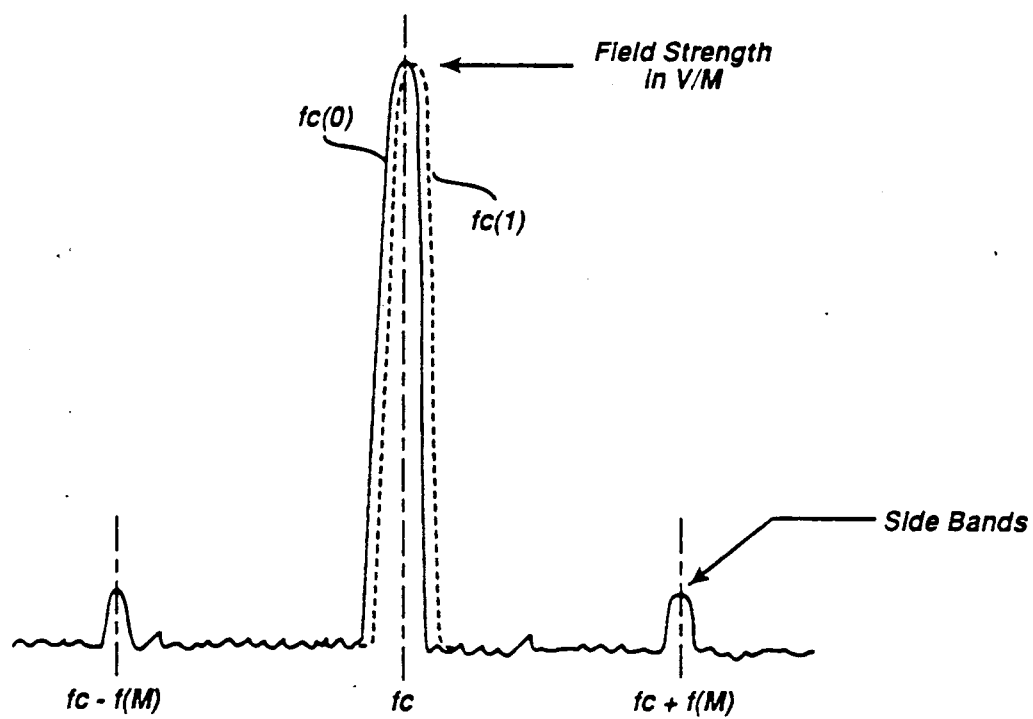
FIG. 4 is a frequency spectrum representation of the transmitted signals.

Time Delay Circuit:

According to the principles of the present invention, it is important that the modulation signal begins and ends at the zero crossing points of the RF driver output. This significantly reduces or eliminates the generated sidebands in the transmitted RF signal 24. These sidebands are illustrated in FIG. 4 as [f(c)-f(m)] and [f(c)+f(m)], where f(c) is the carrier frequency and f(m) is the modulation frequency. Since the modulation clock is derived directly from the RF driver output, it ideally occurs exactly when the RF driver output is at its zero crossing point. However, propagation delays exist which require compensation. For example, in the preferred embodiment shown in FIG. 2, the time delay between the RF driver output on line 120 until in the binary counter 128 reacts causes the modulation clock to be delayed. Additionally, another time delay occurs between when the modulation clock is applied to the shift register 132 until the modulation signal is applied on line 102. These time delays must be compensated for.

A simple, yet effective, method of synchronizing changes in the modulation signal on line 102 with the zero crossing of the RF output on line 120 is shown in the time delay circuit 22 of FIG. 2. The time delay circuit 22 is comprised of a potentiometer 140 and a registor 142 which form a voltage divider and sets via a line 144 the supply voltage of the binary counter 128 and the shift register 132. The binary counter 128 and the shift register 132 in the preferred embodiment are High Speed CMOS devises which have time delays that are functions of their supply voltages. Typically, the time delay from the modulation clock signal until the modulation signal is applied on line 102 will vary from 110 ns to 850 ns as the supply voltage varies from 6V to 2V. The time delay from when the RF driver output passes its zero crossing point until the modulation clock occurs also varies similarly. By adjusting the supply voltage, on line 144, to the binary counter 128 and the shift register 132, the modulation bit can be made to occur synchronously with the RF driver output zero crossing point, as shown in FIGS. 3(d) and 3(e).

The effect of the present method of modulation on a transmitted RF signal 24 is illustrated in FIG. 4. When the modulation bit applied on the line 102 is a 0, a frequency fc(0) is radiated. When the modulation bit on line 102 is a 1, a frequency fc(1) is radiated. The result is radiated energy highly concentrated in one of two carrier frequencies, with the frequency dependent upon the modulation bit.

Figure 5:
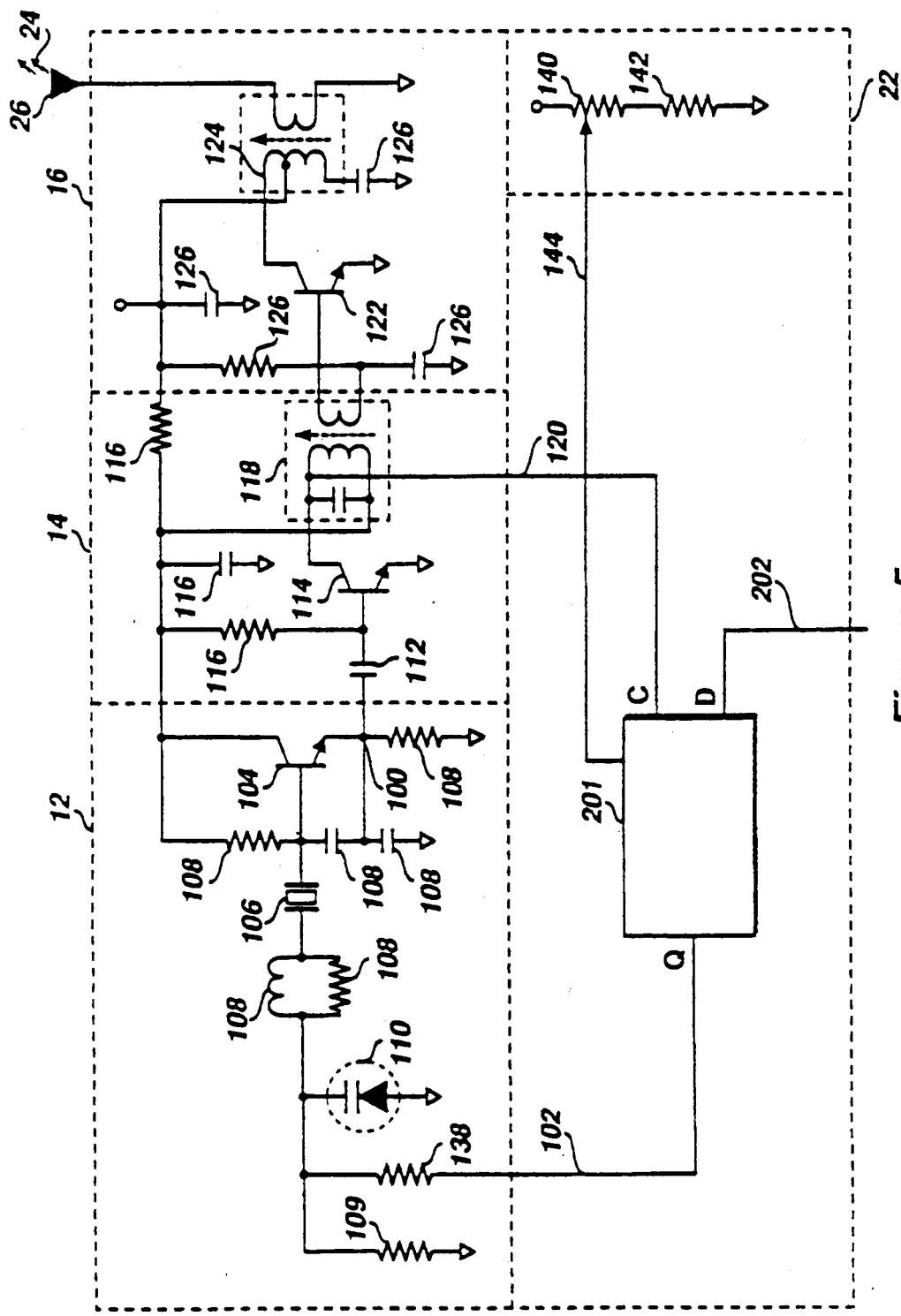
FIG. 5 is a schematic diagram showing an alternate embodiment of the present invention.

Another embodiment of the present invention is shown in FIG. 5. This embodiment uses the same modulator/oscillator 12, RF driver 14, transmitter 16, time delay circuit 22, and antenna 26 as the embodiment in FIG. 2. However, the binary counter 18 and the shift register 20 circuits of FIG. 2 have been replaced by a flip/flop 201. The RF output on line 120 is connected directly to the clock input of the flip/flop 201, the data input line of the flip flop 201 is connected to a line 202, the flip/flop 201 input power is via line 144, and the true data output of the flip/flop 201 is connected to line 102. A data bit to be transmitted is applied on the line 202. When the RF output on line 120 rises past the clocking threshold of the flip/flop 201, the data bit is caused to appear on the modulation line 102. Because of the finite operating speed of the flip/flop 201, the data bit is not applied instantaneously on the modulation line 102. By adjusting the supply voltage of the flip/flop 201, on line 144, the modulation bit can be made to occur synchronously with the RF driver output zero crossing point.

Radiated RF signals modulated according to the principles of the present invention can be demodulated by a number of prior art FM demodulators. A suitable demodulator is the Foster-Seeley demodulator, described in the "Electronic Designers' Handbook," second edition, pages 24-151 through 24-153. As the RF signal is modulated by a digital signal, a digitizing circuit beneficially will follow the demodulator. A typical digitizing circuit is the Schmidt trigger, described in the just mentioned handbook, pages 19-17 through 19-21.

From the foregoing, it will be appreciated that the present invention provides a system of modulating an RF signal with digital data such that modulation occurs substantially only on the zero crossing points of the transmitted RF signal. It will also be appreciated that although a block diagram and a detailed component level diagram of the preferred embodiment of the present invention have been described to illustrate the operation of the present invention, modifications may be made without departing from the spirit or scope of the present invention. Accordingly, the invention is not to be limited except by the appended claims.

What is claimed is:

1. A method of modulating a radio frequency signal, comprising the steps of:
    (a) generating an oscillator signal;
    (b) monitoring said oscillator signal to determine the zero crossing point of the oscillator signal:
    (c) storing an applied data bit; and
    (d) modulating the oscillator signal with said data bit with transitions between successive data bits occurring substantially at the zero crossing points of the oscillator signal.

2. A method of modulating a radio frequency signal, comprising the steps of:
    (a) generating an adjustable oscillator frequency;
    (b) creating a clock pulse from said oscillator frequency;
    (c) storing an applied data bit;
    (d) outputting said data bit in response to said clock pulse, said data bit being output such that the delay in generating said clock pulse from said oscillator frequency and the delay of outputting said data bit in response to said clock pulse are compensated for so that transitions between successive data bits occur substantially synchronously with the zero crossing points of said oscillator frequency; and
    (e) adjusting the oscillator frequency to a frequency value which is dependent upon said output data bit.

3. A radio frequency modulator, comprising:
    an oscillator having an output signal;
    zero detecting means for detecting when said output signal is at its zero crossing point;
    storage means for storing an applied data bit; and
    modulation means for modulating said output signal with said data bit with transitions between successive data bits occurring substantially at said output signal zero crossing points.

4. The modulator according to claim 3 wherein said zero detecting means and said storage means comprise a flip-flop having a clock input driven by said output signal.

5. A radio frequency modulator, comprising:
    an oscillator having an adjustable frequency output;
    zero detecting means for detecting when said frequency output is substantially at its zero crossing point;
    storage means for storing an applied data bit;
    modulation means for adjusting said frequency output to a frequency value which is dependent upon said data bit; and
    time delay means for synchronizing the operation of the modulation means to adjust said frequency output with transitions between successive data bits occurring substantially at said frequency output zero crossing points.

6. A radio frequency modulator, comprising:
    an oscillator having an adjustable frequency output;
    modulation means for adjusting said frequency output to a frequency value which is dependent upon an input data bit;
    clock means for generating a clock pulse from said frequency output;
    register means for storing an applied data bit and for outputting said data bit in response to said clock pulse, said register means having an output means for applying said data bit as an input bit to said modulation means: and
    time delay means for synchronizing the operation of the modulation means, said register means, and said clock means so that said oscillator changes its frequency when said frequency is at its zero crossing point.

7. The modulator according to claim 6 wherein said register means includes a shift register.

8. The modulator according to claim 7 wherein said oscillator includes an amplifying RF driver.

9. The modulator according to claim 8 wherein said frequency output is voltage adjusted.

10. The modulator according to claim further including:
    a transmitter operatively connected to said RF driver; and
    an antenna for radiating a signal derived from said frequency output, said antenna being operatively connected to said transmitter.

* * * * *

UNITED STATES PATENT AND TRADEMARK OFFICE
CERTIFICATE OF CORRECTION

PATENT NO. : 5,030,928

DATED : July 9, 1991

INVENTOR(S) : Wilson H. K. Ho

It is certified that error appears in the above-identified patent and that said Letters Patent is hereby corrected as shown below:

In column 6, claim 10, line 61, after "claim" please insert -- 8 --.

Signed and Sealed this

First Day of December, 1992

Attest:

DOUGLAS B. COMER

Attesting Officer        Acting Commissioner of Patents and Trademarks